United States Patent
Siessegger et al.

(10) Patent No.: US 9,859,812 B2
(45) Date of Patent: Jan. 2, 2018

(54) AUXILIARY POWER SUPPLY FOR LIGHTING DRIVER CIRCUITRY

(71) Applicants: OSRAM SYLVANIA INC., Danvers, MA (US); Bernhard Siessegger, Danvers, MA (US); Colin Coleman, Danvers, MA (US)

(72) Inventors: Bernhard Siessegger, Danvers, MA (US); Colin Coleman, Middleton, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 558 days.

(21) Appl. No.: 14/373,075

(22) PCT Filed: Jan. 21, 2013

(86) PCT No.: PCT/US2013/022426
§ 371 (c)(1),
(2) Date: Jul. 18, 2014

(87) PCT Pub. No.: WO2013/110044
PCT Pub. Date: Jul. 25, 2013

(65) Prior Publication Data
US 2014/0361623 A1    Dec. 11, 2014

Related U.S. Application Data

(60) Provisional application No. 61/588,838, filed on Jan. 20, 2012.

(51) Int. Cl.
*H02M 7/06* (2006.01)
*H05B 37/02* (2006.01)
(Continued)

(52) U.S. Cl.
CPC ............ *H02M 7/06* (2013.01); *H01L 25/167* (2013.01); *H01L 27/156* (2013.01); *H01L 33/62* (2013.01);
(Continued)

(58) Field of Classification Search
CPC ............................ H02M 7/06; H05B 33/0806
See application file for complete search history.

(56) References Cited

U.S. PATENT DOCUMENTS 6,147,935 A * 11/2000 Guyett .................. G04G 19/10
368/204

FOREIGN PATENT DOCUMENTS

WO    WO2008/112820 A2    9/2008

OTHER PUBLICATIONS

PCT Search Report, dated May 17, 2013.

* cited by examiner

*Primary Examiner* — Jared Fureman
*Assistant Examiner* — James Evans
(74) *Attorney, Agent, or Firm* — Yutian Ling

(57) ABSTRACT

Techniques for supplying auxiliary power to lighting driver circuitry are disclosed. An auxiliary power supply can be used, for example, to provide auxiliary power to a current source that drives an LED string. In some embodiments, the LED string is effectively used as a series resistor to charge a capacitor that provides the auxiliary voltage $V_{aux}$. As soon as the capacitor is charged to a given threshold, the LED string can be disconnected from the capacitor and the current through the LED string bypasses the auxiliary supply circuit. Thus, the current source provides a current through the LED string, which in turn may be selectively fed to the auxiliary power supply to provide auxiliary power back to the current source or to provide auxiliary power to other circuitry.

18 Claims, 15 Drawing Sheets

(51) Int. Cl.

| | |
|---|---|
| *H05B 33/08* | (2006.01) |
| *H01L 25/16* | (2006.01) |
| *H05B 41/39* | (2006.01) |
| *H01L 27/15* | (2006.01) |
| *H01L 33/62* | (2010.01) |
| *H01L 25/075* | (2006.01) |
| *G01R 31/26* | (2014.01) |
| *G01R 31/40* | (2014.01) |
| *G01R 31/44* | (2006.01) |
| *G01R 31/02* | (2006.01) |

(52) U.S. Cl.
CPC ....... *H05B 33/0803* (2013.01); *H05B 33/083* (2013.01); *H05B 33/086* (2013.01); *H05B 33/0806* (2013.01); *H05B 33/0812* (2013.01); *H05B 33/0815* (2013.01); *H05B 33/0821* (2013.01); *H05B 33/0827* (2013.01); *H05B 33/0845* (2013.01); *H05B 33/0848* (2013.01); *H05B 33/0851* (2013.01); *H05B 33/0884* (2013.01); *H05B 33/0893* (2013.01); *H05B 37/02* (2013.01); *H05B 37/0209* (2013.01); *H05B 41/39* (2013.01); *G01R 31/028* (2013.01); *G01R 31/2633* (2013.01); *G01R 31/2635* (2013.01); *G01R 31/40* (2013.01); *G01R 31/44* (2013.01); *H01L 25/0753* (2013.01); *H01L 2224/48091* (2013.01); *H01L 2224/48227* (2013.01); *H01L 2224/48247* (2013.01); *H01L 2924/12032* (2013.01); *H01L 2924/12044* (2013.01); *H01L 2924/1301* (2013.01); *H01L 2924/1305* (2013.01); *H01L 2924/13033* (2013.01); *H01L 2924/13091* (2013.01); *Y02B 20/343* (2013.01); *Y02B 20/345* (2013.01); *Y02B 20/346* (2013.01); *Y02B 20/347* (2013.01); *Y10T 307/615* (2015.04)

AUXILIARY POWER SUPPLY FOR LIGHTING DRIVER CIRCUITRY

RELATED APPLICATIONS

This application is a U.S. National Stage application of, and claims the benefit of, International Application PCT PCT/US2013/022426, filed Jan. 21, 2013, which claims the benefit of Provisional Application No. 61/588,838, filed Jan. 20, 2012. Each of these applications is herein incorporated by reference in its entirety.

FIELD OF THE DISCLOSURE

The present application relates to lighting driver circuitry, and more specifically to auxiliary power supplies for lighting driver circuitry such as non-isolated constant current LED drivers.

BACKGROUND

Providing an auxiliary current source to lighting driver circuitry may involve providing one or more low-voltage DC power supplies. These auxiliary low-voltage DC supply voltages may be provided by linear voltage regulators. Such auxiliary sources involve a number of non-trivial challenges.

DETAILED DESCRIPTION

Techniques for supplying auxiliary power to lighting driver circuitry are disclosed. An auxiliary power supply can be used, for example, to provide auxiliary power to a current source that drives an LED string. In some example embodiments, the LED string is effectively used as a series resistor to charge a capacitor that provides the auxiliary voltage $V_{aux}$. In such cases, the power going into the series resistance (LED string) is not loss power (as it would be in the case of a conventional linear regulator), as the LEDs need to be powered anyhow to provide light. As soon as the $V_{aux}$ capacitor is charged to a nominal voltage of the auxiliary power source, the LED string can be disconnected from the capacitor and the current through the LED string bypasses the auxiliary power supply circuit. Thus, the current source provides a current through the LED string, which in turn may be fed to the auxiliary power supply to provide auxiliary power back to the current source and/or to provide auxiliary power to other circuitry. A switch may disconnect the auxiliary power supply from the LED current after there is sufficient charge within the auxiliary power supply. The driver may be powered from AC or DC input. Numerous configurations and variations will be apparent in light of this disclosure.

General Overview

Figure 1A:
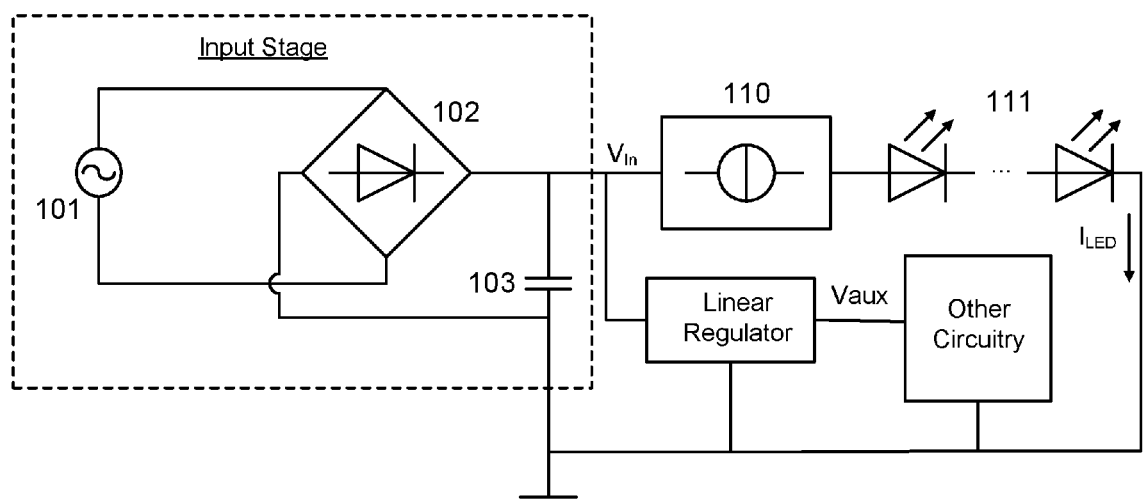
FIG. 1a shows a circuit design for an LED lighting system including a linear regulator providing auxiliary power to other circuitry of an LED driver.
Figure 1B:
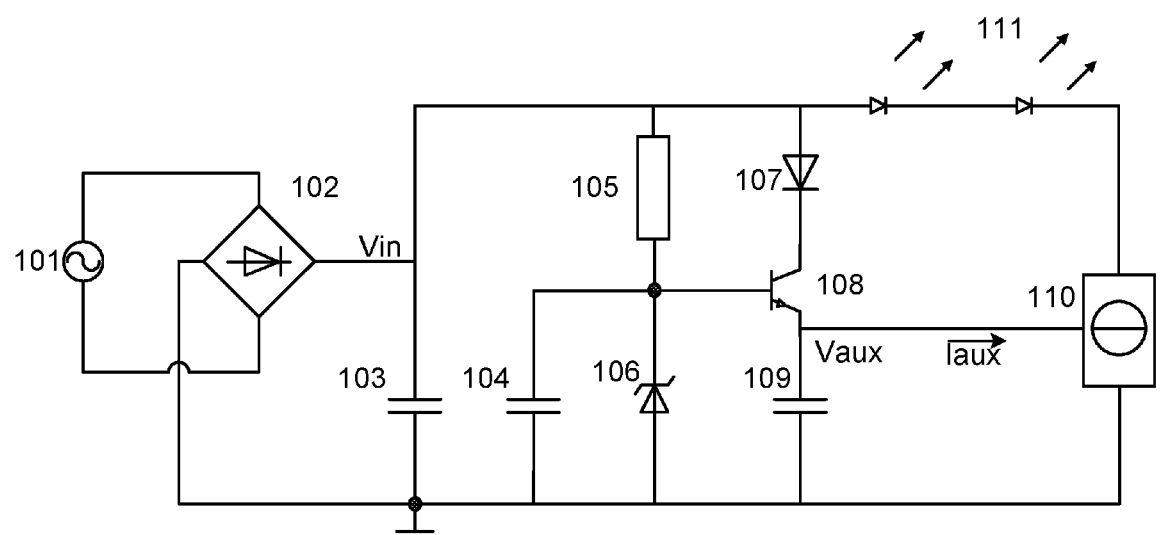
FIG. 1b shows another circuit design of a LED driver with an auxiliary power supply.

As previously noted, provisioning auxiliary sources in lighting driver circuitry involves a number of non-trivial challenges. For instance, the dissipated power in a linear regulator typically used to provide such auxiliary sources may produce a significant loss of power—even if the linear regulator would be an ideal component due to its nature of operation. In more detail, lighting driver circuitry may require an internal source of power to provide for its own functionality. Lighting driver circuitry may include, for example, LED drivers, electronic ballasts for fluorescent lighting systems, incandescent lighting circuitry, devices to control other lighting circuitry or other suitable lighting circuitry. In the context of LED drivers, the internal power source would simply power the core function of supplying a constant current to an LED string. Modern drivers may incorporate additional capabilities as well, such as communications, brightness, and color control. Regardless of the functionality, a highly efficient auxiliary power source is desirable in order to realize a high efficiency for the entire driver. FIG. 1a shows a circuit design for an LED lighting system including a linear regulator providing auxiliary power to other circuitry of an LED driver. As can be seen, in this particular example the input stage of the circuit includes an AC source 101 which provides a signal to a voltage rectifier 102, which is connected to capacitor 103. In other embodiments, the AC input stage may not be necessary in the case of a DC powered driver. In this example, the input stage provides voltage Vin to current source 110, which provides a constant current $I_{LED}$ through the LED string 111. In some embodiments, current source 110 may be a switch mode converter or linear regulator that provides current to the LEDs. In this example, the input stage is also connected to a linear regulator, which behaves as a variable series resistance, providing a desired output Vaux to other circuitry, which may include the control circuitry of the LED driver (microcontroller circuitry, control of the power stage, communication with light management system/overall control system/building automation system, other circuitry in general, etc.). FIG. 1b shows a circuit design for an LED lighting system based on a non-isolated constant current LED driver implementing a linear voltage regulator. As can be seen, an AC source 101 provides a signal to a voltage rectifier 102, which is connected to capacitor 103, and the auxiliary power supply. The auxiliary power supply is a linear voltage regulator including capacitors 104 and 109, Zener diode 106, diode 107, resistor 105, and transistor 108. The output of transistor 108 provides an auxiliary current $I_{aux}$ and auxiliary voltage $V_{aux}$ to the current source 110. The constant current source 110 in this design only requires a single auxiliary supply voltage and provides a constant current through the LED string 111. The voltage drop across the linear regulator multiplied by the auxiliary current drawn by the control circuit determines the power dissipated, and hence lost in the linear regulator. Especially in applications with high input voltages (e.g., off the mains power drivers), the dissipated power can be substantial and may diminish the overall efficiency and/or thermal performance of the LED driver. If the input capacitor 103 of the circuit shown in FIG. 1b is large, then the ripple voltage on the capacitor will be small. In this case, the capacitor voltage $V_{in}$ would be close to peak line voltage (e.g., nominally 170V for a 120 Vac line). Assuming that the auxiliary power supply must provide an auxiliary voltage $V_{aux}$ equal to about 5V, and an auxiliary current $I_{aux}$ equal to about 20 mA, then the dissipated power in an ideal linear regulator would be $(V_{in}-V_{aux})*I_{aux}=(170V-5V)*20$ mA=3.3 W. This is a significant loss of power considering the auxiliary power provided was only 5V*20 mA=0.1 W. In another driver design, the input capacitor 103 of the circuit shown in FIG. 1b is small so that the voltage output of rectifier 102, $V_{in}$, varies between 0V and 170V in a sinusoidal shape. Hence, the average power loss in the auxiliary power supply is not as large as with a larger capacitor, but is still significant. To alleviate the drawbacks of linear regulators, auxiliary power supplies based on (stand-alone) switch-mode power converters may be used. However, as switch-mode power supplies are in general more sophisticated than linear regulators, they may require additional design efforts, more space on a printed circuit board, and at the same time they may add complexity, potential EMI issues, and additional cost to the product.

Thus, and in accordance with an embodiment of the present invention, techniques are disclosed for more efficiently providing auxiliary power to the electronics of a constant current LED driver, by utilizing the existing LED string current to feed the auxiliary power supply. The techniques can generally be implemented with fewer components relative to conventional techniques to provide auxiliary power, thus also increasing cost efficiency and manufacturability compared to a stand-alone auxiliary switch-mode power supply, in accordance with some embodiments. According to one particular embodiment, no magnetics are needed and only two power components: a switch and a diode, are added to provide auxiliary power to a given LED driver circuit. However, embodiments other than non-isolated constant current LED drivers can also benefit from the techniques provided herein, as will be appreciated in light of this disclosure.

The principle of utilizing the LED string current to create the auxiliary supply voltage $V_{aux}$ can be implemented using a number of circuit designs, as will be appreciated in light of this disclosure. In some example cases implemented with a switch, if $V_{aux}$ falls below a first threshold voltage the switch control turns the switch off and the $V_{aux}$ capacitor gets charged by the LED string current. As long as the switch is open $V_{aux}$ rises. However, as $V_{aux}$ reaches a second threshold voltage, the switch control closes the switch. Hence, the LED string current bypasses the auxiliary power supply circuit. A blocking diode can be used to effectively disconnect the auxiliary supply from the main power path.

Circuit Architecture

Figure 2A:
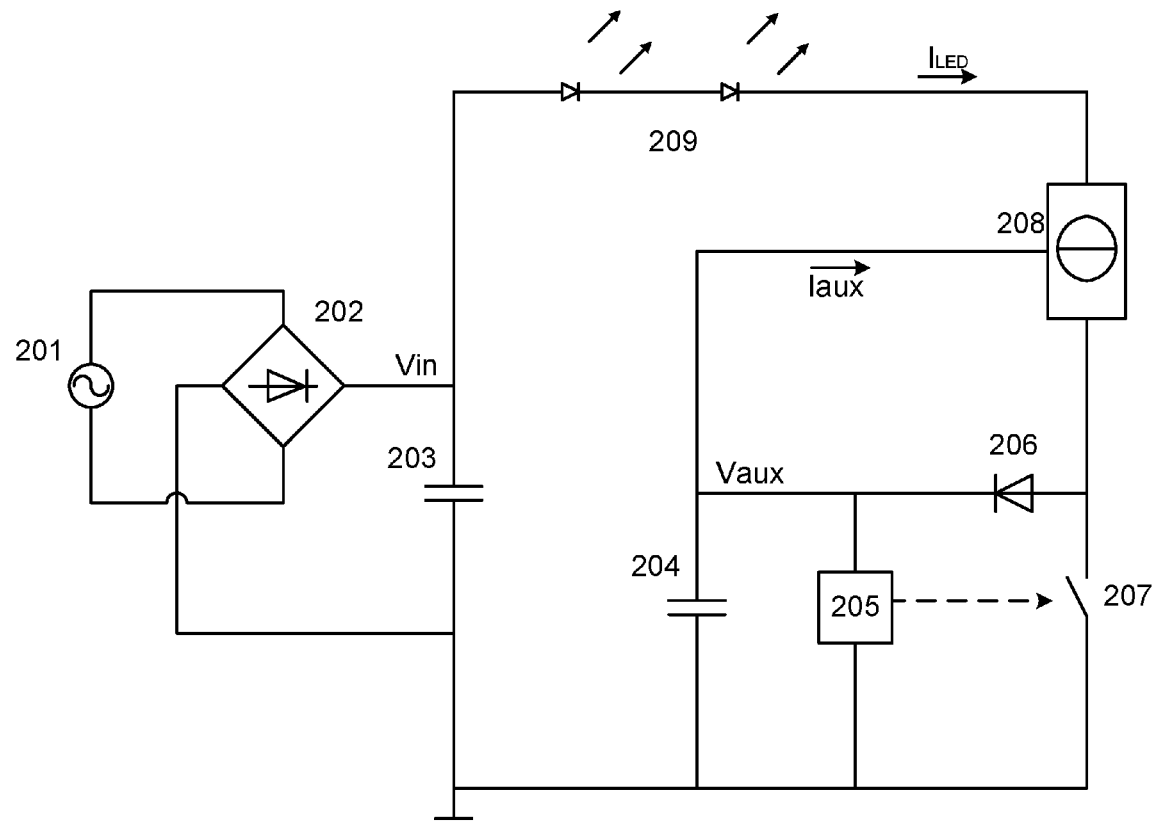
FIG. 2a shows a circuit design of a LED driver utilizing the LED current in the auxiliary power supply, implemented according to one embodiment of the present invention.

FIG. 2a illustrates a circuit design utilizing the LED current to feed the auxiliary power supply, according to one embodiment of the present invention. As can be seen, this particular example embodiment includes an AC voltage source 201, rectifier 202, input capacitor 203, LED string 209, constant current source 208, and an auxiliary power supply circuit. The auxiliary power supply circuit includes capacitor 204, controller 205, diode 206, and switch 207 that is controlled by controller 205. This technique of utilizing the LED current to feed the auxiliary power supply is efficient, as the LED driver must control and provide this LED current anyway. In alternative embodiments, the power source could be a DC voltage source, a battery, or any other suitable power source.

In operation, the current through the LED string 209 is used to create the auxiliary voltage that is fed into the constant current source 208. In more detail, and with further reference to FIG. 2a, the voltage at the output of rectifier 202 is labeled $V_{in}$, the auxiliary voltage at the output of diode 206 is labeled $V_{aux}$, the current through the LED string 209 is labeled $I_{LED}$ and the auxiliary current provided to the current source 208 from the auxiliary power supply circuit is labeled $I_{aux}$. The controller 205 is connected to the output of diode 206, where it can monitor the auxiliary voltage $V_{aux}$, located at the node of capacitor 204, controller 205, and diode 206. If $V_{aux}$ falls below a determined threshold voltage $V_{th1}$, then controller 205 turns switch 207 off. When switch 207 is off, capacitor 204 gets charged by the LED current flowing out of current source 208 and through diode 206. As long as switch 207 is open, $V_{aux}$ rises. As $V_{aux}$ reaches a second threshold voltage $V_{th2}$, controller 205 closes switch 207 and the LED current bypasses diode 206 and capacitor 204, effectively disconnecting the auxiliary supply from the main power path. Diode 206 blocks current from flowing from capacitor 204 back into the output node of the current source 208 and switch 207. Regardless of whether the switch 207 is open or closed the auxiliary current $I_{aux}$ is supplied to the current source 208.

This particular example implementation is very efficient, even if the constant current source 208 has low efficiency (as in an implementation as a linear regulator). Some of the voltage $V_{in}-V_{aux}$ will be seen across the LEDs and will not translate to lost power, which would be the case with a pure linear regulator concept. Additionally, no start-up circuitry is needed as the transistor acting as switch 207 is typically a normally-off device. Not a single high voltage device is needed for the auxiliary power supply, keeping cost down, in accordance with some embodiments. Any design efforts making the current source 208 more efficient (e.g., by using a switch-mode concept) will similarly make the auxiliary power supply more efficient. In order to avoid power loss in the switch 207, the switching action can be sufficiently fast. In particular, if one demands very little (e.g. <1% change in amplitude) in the LED string current, a current source with a very fast dynamical response might be required, otherwise the LED current and potentially the light generated by the LED source may show modulation. The modulation will be constant in frequency, assuming a fairly constant LED string current $I_{LED}$ and auxiliary current $I_{aux}$. As will be appreciated, 'constant' generally refers to a current that is unchanging or that otherwise changes only within an acceptable tolerance for a given application.

To make sure that no flicker will be perceivable even with a current source exhibiting poor dynamical response, the capacitor 204 can be kept small enough to ensure that the switching frequency of switch 207 is above the frequency that the human eye is able to detect (e.g., $f_{Flicker}$=80 Hz, or higher). During the off state of switch 207, the charge transferred to capacitor 204 ($C_{204}$) is: $Q_{off}=(I_{LED}-I_{aux})*T_{off}$ (referred to as Equation 1 herein after), with $T_{off}$ being the time duration the switch 207 is in off state. During the on state of switch 207, the charge transferred from capacitor 204 is: $Q_{on}=I_{aux}*T_{on}$ (referred to as Equation 2 herein after), with $T_{on}$ being the time duration the switch 207 is in on state. Equations 1 and 2 assume that $I_{LED}$ and $I_{aux}$ are constant currents, and the current consumed by the controller 205 is negligible, which both are good approximations in almost all cases relevant to practical applications. In steady state, the capacitor voltage oscillates between the lower voltage threshold $V_{th1}$ and upper voltage threshold $V_{th2}$, hence the voltage swing of the capacitor 204 is $V_{th2}-V_{th1}$. In steady state the electrical charge during on and off state of the switch are equal: $Q_{off}=Q_{on}=C_{204}*(V_{th2}-V_{th1})$ (referred to as Equation 3 herein after), with $C_{204}$ being the value of the capacitor 204. The switching frequency of switch 207 is $f_{207}=1/T_{on}+T_{off}$. This frequency is identical with the frequency of the voltage ripple on $V_{aux}$ (one may also refer to FIG. 2d for illustration). The switching period T is defined as $1/f_{207}$ and given by the equation below:

$$T = C_{204}(V_{th1} - V_{th2})\left[\frac{1}{I_{LED} - I_{aux}} + \frac{1}{I_{aux}}\right]$$

When the switching frequency $f_{207}$ equals the flicker frequency $f_{Flicker}$, capacitor 204 is chosen to the maximum allowed capacity $C_{max}$, which can be calculated from the formula:

$C_{max}=I_{aux}*(I_{LED}-I_{aux})/(f_{Flicker}*(V_{th2}-V_{th1})*I_{LED})$.

For ideal components, there is no maximum allowed capacity $C_{max}$. The same is true for the minimum allowed capacity $C_{min}$. But for practical applications, a maximum switching frequency of switch 207 can be used to define the lower limit to the capacitance of capacitor 204. Because, as previously discussed, it may be desirable to keep capacitor 204 relatively small in some applications, a significant voltage ripple might be present on the auxiliary voltage $V_{aux}$. In case of stringent voltage ripple requirements (e.g., because the auxiliary voltage is used as a reference voltage for an analog to digital converter), this can be overcome by cascading this first auxiliary voltage supply stage with a second stage. In one embodiment, this second stage may include a low-drop linear regulator (discussed in more detail with reference to FIG. 3), implemented after diode 206 in order to reduce the ripple on $V_{aux}$.

Figure 2B:
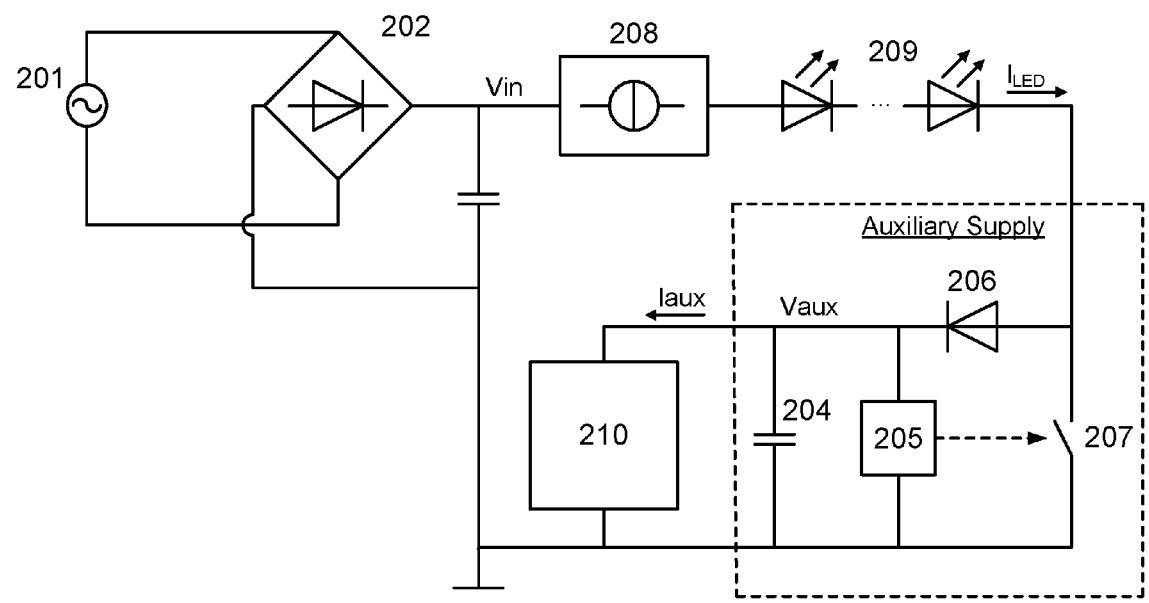
FIG. 2b shows a circuit design of a LED driver utilizing the LED current in the auxiliary power supply, implemented according to another embodiment of the present invention.

FIG. 2b illustrates a circuit design utilizing the LED current to feed the auxiliary power supply, according to another embodiment of the present invention. Similar to the embodiment shown in FIG. 2a, this particular example embodiment includes an AC voltage source 201, rectifier 202, input capacitor 203, LED string 209, constant current source 208, and an auxiliary power supply circuit. The auxiliary power supply circuit includes capacitor 204, controller 205, diode 206, and switch 207 that is controlled by controller 205. In alternative embodiments, the power source could be a DC voltage source, a battery, or any other suitable power source. In contrast to the example shown in FIG. 2a, however, in this example the auxiliary supply circuitry provides auxiliary voltage Vaux and auxiliary current Iaux to a secondary circuit 210 which may be part of the LED driver. In some embodiments, the secondary circuit 210 may include the control circuitry of the LED driver (microcontroller circuitry, control of the power stage, communication with light management system/overall control system/building automation system, other circuitry in general, etc.).

Figure 2C:
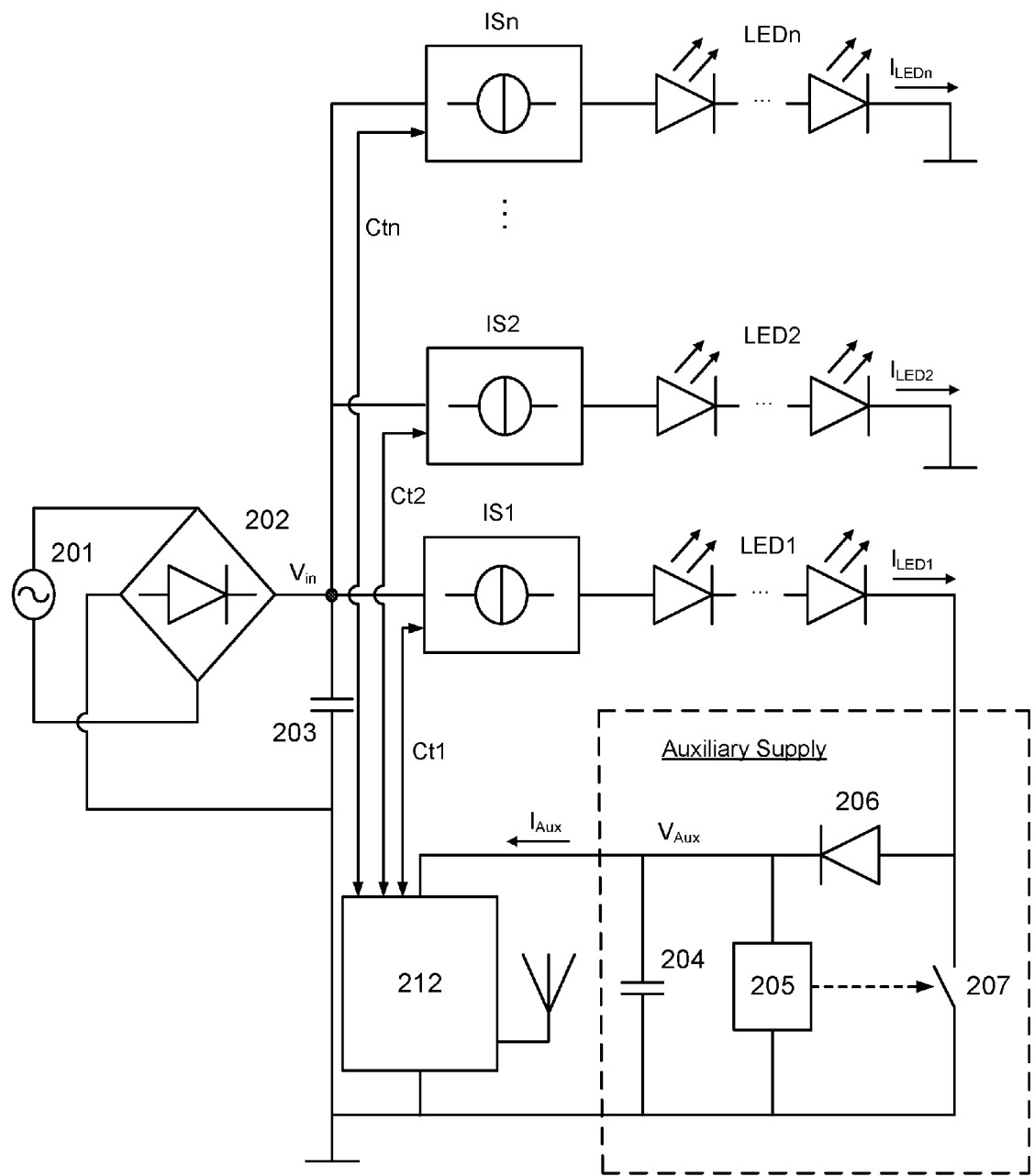
FIG. 2c illustrates a multi-channel LED driver with n channels which powers n LED strings by means of the n current sources IS1 through ISn, according to one embodiment of the present invention.

FIG. 2c illustrates a multi-channel LED driver with n channels which powers n LED strings by means of the n current sources IS1 through ISn, according to one embodiment of the present invention. Similar to the embodiment shown in FIG. 2a, this particular example embodiment includes an AC voltage source 201, rectifier 202, input capacitor 203, and an auxiliary power supply circuit. The auxiliary power supply circuit includes capacitor 204, controller 205, diode 206, and switch 207 that is controlled by controller 205. In alternative embodiments, the power source could be a DC voltage source, a battery, or any other suitable power source. In contrast to the example shown in FIG. 2a, however, the present LED driver example includes multiple current sources IS1, IS2, . . . ISn, as well as multiple LED strings LED1, LED2, . . . LEDn, each with their own LED current $I_{LED1}$ $I_{LED2}$, . . . $I_{LEDn}$. In this particular example, the current source IS1 is also utilized to provide power to the auxiliary supply circuitry, however, any of the other current sources could be used for this purpose. In this example, the auxiliary supply is not providing power to the current sources, but rather to the control stage 212, which is connected to the various current sources with control lines Ct1, Ct2, . . . Ctn. In one example embodiment, the control stage 212 may include a microcontroller and a transmitter & receiver radio (transceiver) to establish a wireless meshed network communication (based on the ZigBee standard, for example) with other wireless lighting devices. In such an example, the control stage may control the individual string currents $I_{LED1}$ through $I_{LEDn}$ by commanding the set current of the current sources via control lines Ct1-Ctn. In such an embodiment, the light intensity of each LED string may be set individually through a wireless interface.

In this particular example, the control lines Ct1-Ctn are shown as bidirectional communication lines that may be used for acknowledgement or error correction as well as communication of values from the current sources to the control stage, like the temperature of the current sources which may be used for over-voltage protection purposes. In case of relatively close proximity of the current source to the respective LED string, the current sources may communicate data to the control stage for color tuning in order to offset spectral shift of the color of the emitted light caused by a variation of the LED temperature.

In one particular embodiment, 5 LED strings were chosen, with a red, green, blue, warm white, and cold white LED string. In this example, all LEDs in one particular LED string are made of LEDs of the same kind and the LEDs of all 5 strings are placed on a small printed circuit board inside a spot lighting luminaire in which the light of all LEDs is mixed, thus making a spot lighting with tunable color and intensity with the communication and drive scheme described above. In such an example, the auxiliary supply within the 5-channel LED driver may be supplied by the current running through LED string LED1, which might be pulse-width modulated and/or amplitude modulated by the current source IS1 in order to adjust the average LED current.

Figure 2D:
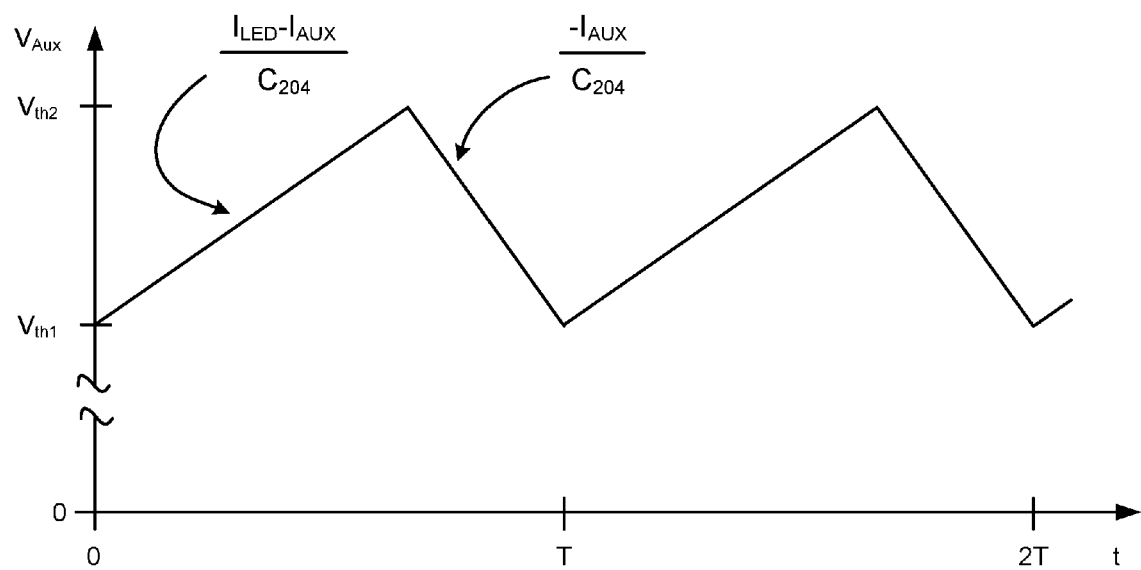
FIG. 2d shows a graph of Vaux of FIGS. 2a-2c as a function of time (assuming that ILED and Iaux are constant currents, which is a good approximation in almost all cases relevant to practical applications).

FIG. 2d shows a graph of Vaux of FIGS. 2a-2c as a function of time (assuming that $I_{LED}$ and $I_{aux}$ are constant currents, and the current consumed by the controller 205 is negligible, which both are good approximations in almost all cases relevant to practical applications). The figure also gives the slopes of the sawtooth waveform of Vaux.

Figure 2E:
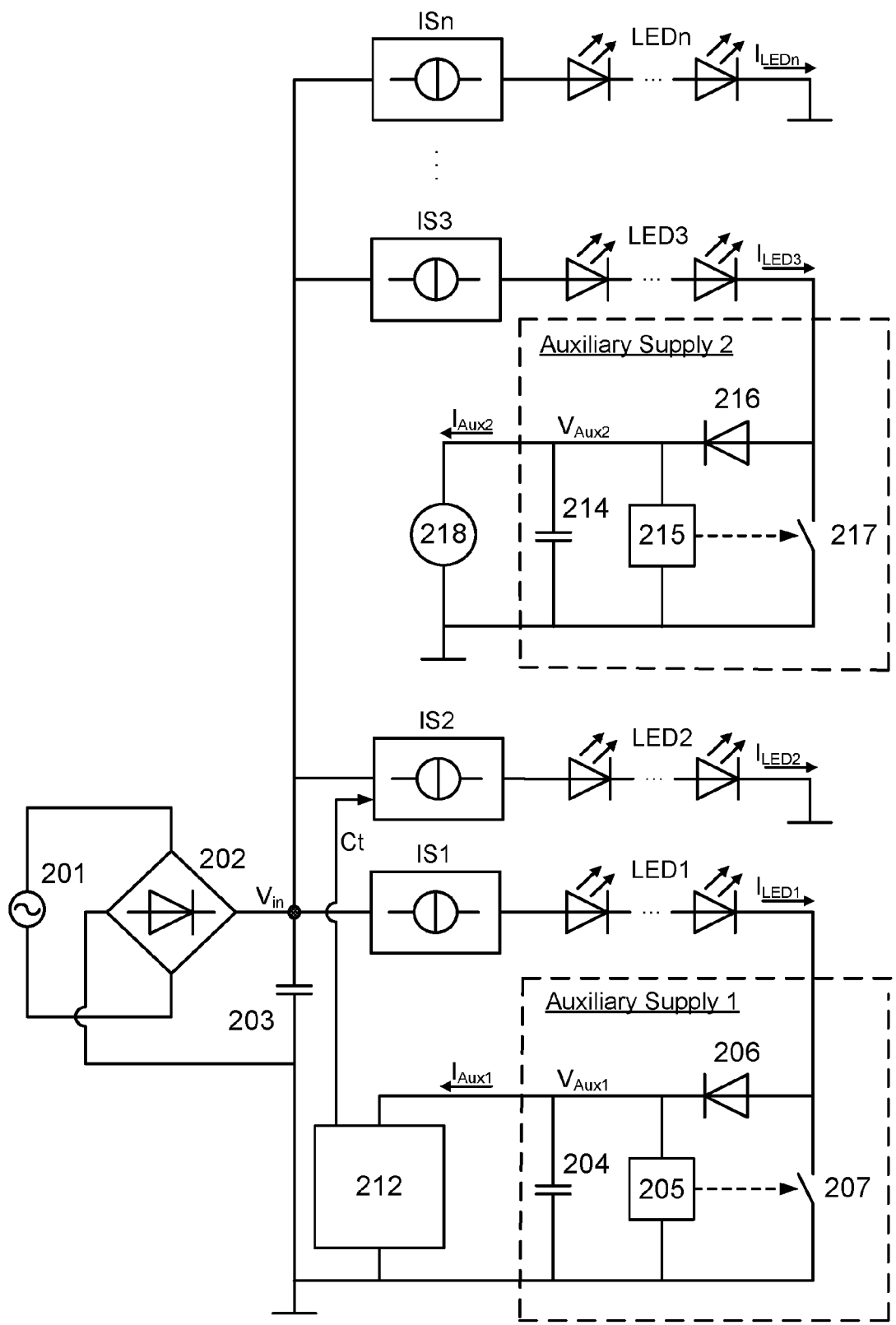
FIG. 2e illustrates a multi-channel LED driver with n channels which powers LED strings LED1-LEDn and includes two auxiliary supplies providing auxiliary voltages, according to one embodiment of the present invention.

FIG. 2e illustrates a multi-channel LED driver with n channels which powers LED strings LED1-LEDn and includes two auxiliary supplies providing auxiliary voltages, according to one embodiment of the present invention. In this example embodiment, two auxiliary supplies provide the auxiliary voltages $V_{aux1}$ and $V_{aux2}$. $V_{aux1}$ may provide power to the control stage 212. In this particular embodiment, control stage 212 includes a microcontroller that reads the desired dimming level for the second LED string, LED2, through a 0-10V Dimming Interface (not shown) and sets the set current of the current source IS2 through a unidirectional communication line Ct. In this particular example, a first auxiliary power supply circuit, Auxiliary Supply 1, includes capacitor 204, controller 205, diode 206, and switch 207 that is controlled by controller 205. In alternative embodiments, the power source could be a DC voltage source, a battery, or any other suitable power source. In the example shown, a second auxiliary supply, Auxiliary Supply 2, includes diode 216, switch 217, controller 215, and capacitor 214. $V_{aux2}$ may be supplied to circuitry outside of the LED driver—in this particular case to a motor 218, which is part of a fan for cooling the LED arrangement in one such embodiment. The motor may be connected to terminals on the driver (similar to the terminals which provide connection to the LED strings). In other embodiments of the present invention, multiple auxiliary supplies may be implemented to provide additional auxiliary voltages to operate circuitry within or even outside of the LED driver. Independent auxiliary supply sections would be created in a similar fashion as the two illustrated in FIG. 2e.

Figure 2F:
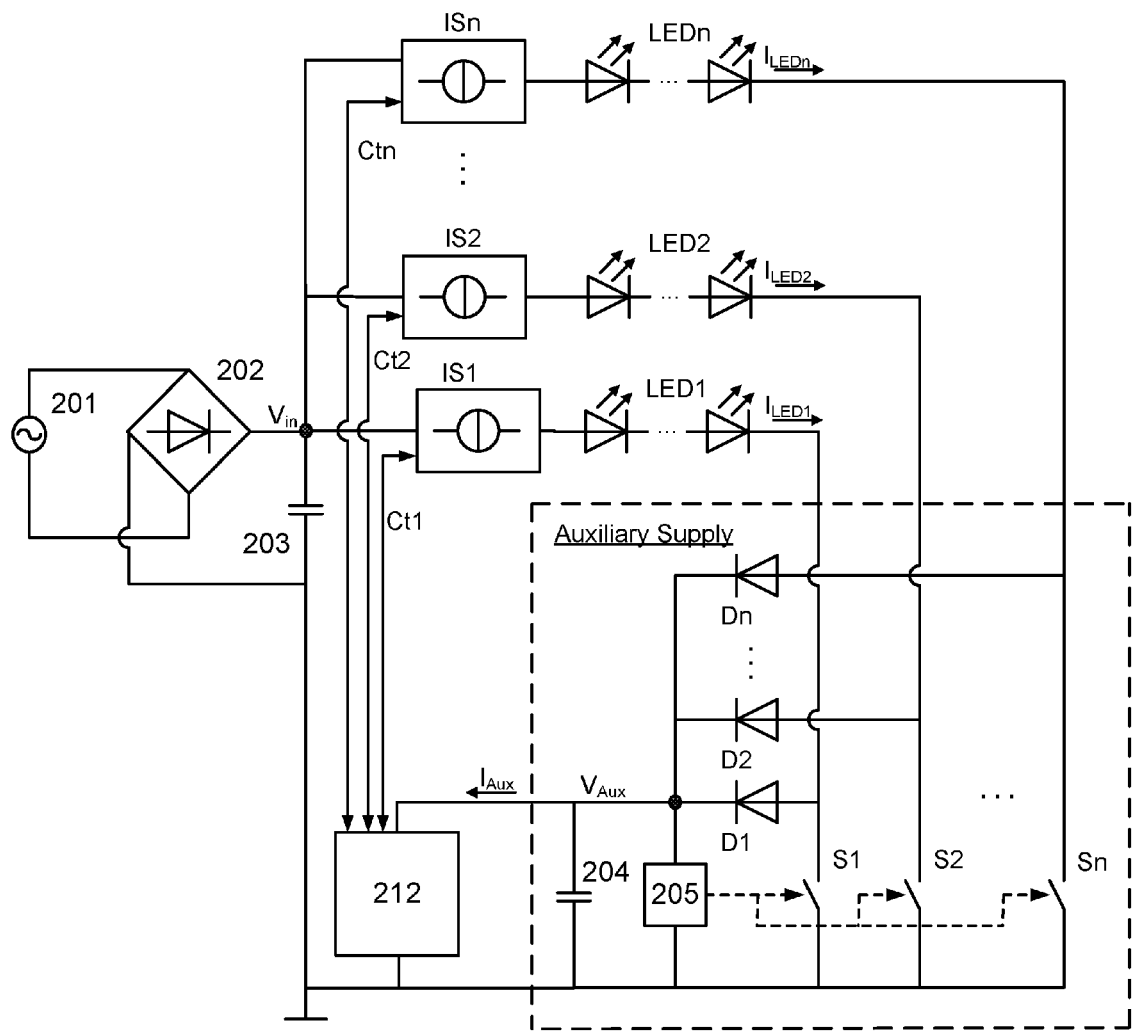
FIG. 2f illustrates a multi-channel LED driver which provides power to an auxiliary supply from multiple LED strings, according to one embodiment of the present invention.

FIG. 2f illustrates a multi-channel LED driver which provides power to an auxiliary supply from multiple LED strings, according to one embodiment of the present invention. This particular example embodiment includes an AC voltage source 201, rectifier 202, input capacitor 203, and an auxiliary power supply circuit. The present LED driver example includes multiple current sources IS1, IS2, . . . ISn, as well as multiple LED strings LED1, LED2, . . . LEDn, each with their own LED current $I_{LED1}$, $I_{LED2}$, . . . $I_{LEDn}$. This example also includes an auxiliary supply with a controller 205, capacitor 204, a number of n switches S1-Sn, and a number of n diodes D1-Dn, connected to a number of n LED strings LED1-LEDn. In this example, the auxiliary supply provides auxiliary power to a control stage 212, which is connected to the various current sources IS1-ISn by control lines Ct1-Ctn, as described in reference to FIG. 2c. In this specific example, the auxiliary supply can receive current from all or any of the LED strings ($I_{LED1}$ through $I_{LEDn}$) in order to create the auxiliary voltage Vaux and auxiliary current Iaux. The control 212 may open or close all switches S1-Sn at the same time and allow the LED currents $I_{LED1}$-$I_{LEDn}$ flow through diodes D1-Dn. Such an embodiment may help alleviate the restriction on minimal dimming. In the embodiment shown in FIG. 2c, one was only able to dim string LED1 down so far until the time (mean) averaged LED current $<I_{LED1}>$ was equal to the consumed time (mean) averaged auxiliary current $<I_{Aux}>$. In the example circuit shown in FIG. 2f, the constraint is more relaxed such that the time averaged LED current is equal to $<I_{LED1}+I_{LED2}+ \ldots +I_{LEDm}>$ and allows for increased dimming of any one individual LED string without falling below the time averaged auxiliary current $<I_{Aux}>1$.

Figure 2G:
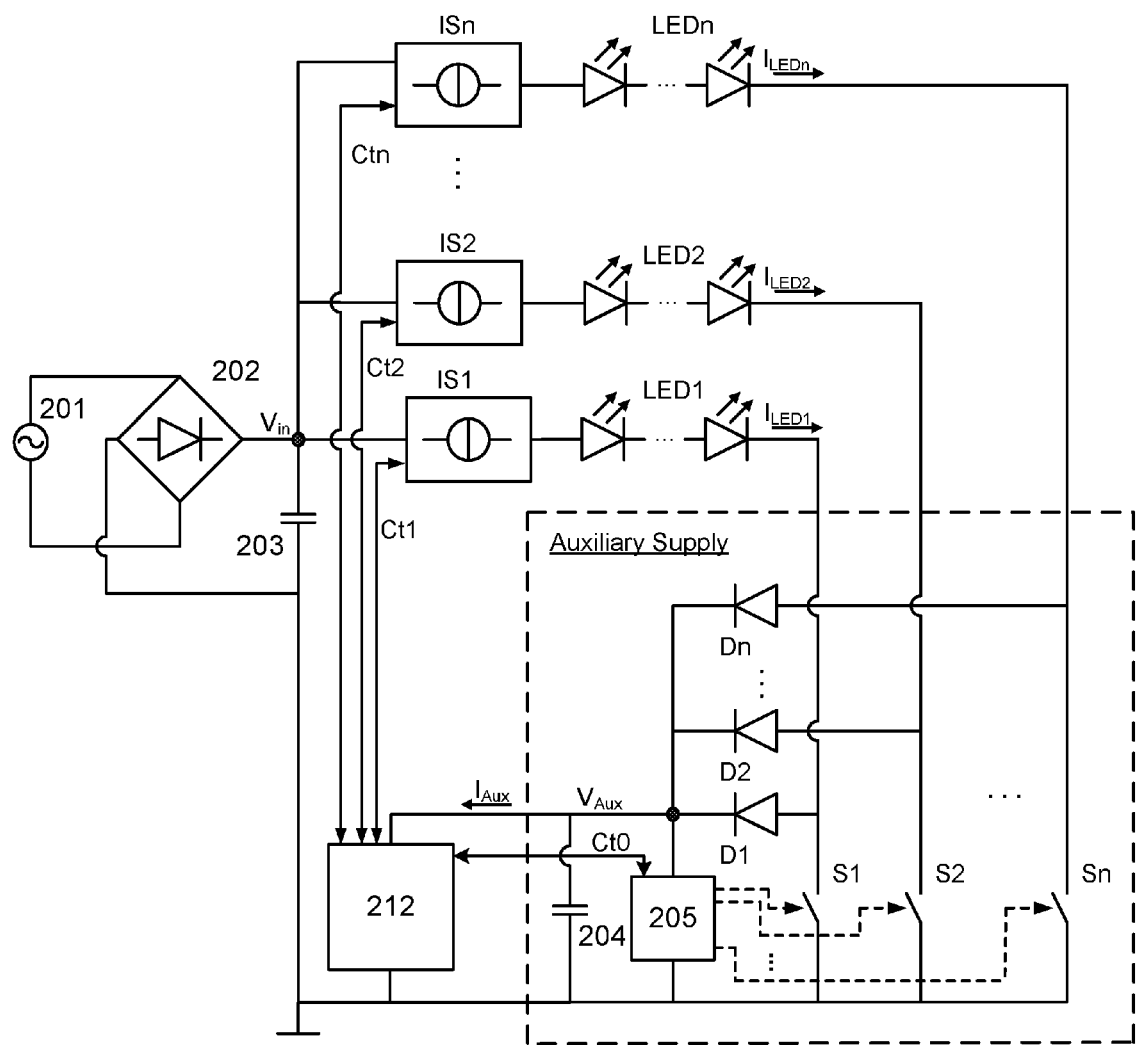
FIG. 2g illustrates a multi-channel LED driver which provides power to an auxiliary supply from multiple LED strings wherein the switches within the auxiliary supply may be independently controlled, according to one embodiment of the present invention.

FIG. 2g illustrates a multi-channel LED driver which provides power to an auxiliary supply from multiple LED strings wherein the switches within the auxiliary supply may be independently controlled, according to one embodiment of the present invention. The circuit shown in FIG. 2g is similar to the one illustrated by FIG. 2f, except that it uses an even more generalized approach for auxiliary supply: All the switches can be controlled independently by the control 205 of the auxiliary supply. This specific example circuit includes all the elements shown in FIG. 2f, as well as the control line Ct0. In such an embodiment, the control line Ct0 may allow the control 205 to receive information about the set currents of all the current sources IS1-ISn. With this information the control 205 is able to select one or more switches to act periodically depending on the state of charge of the capacitor 204, as previously described. Depending on the control method realized in the control 205, the control may be able to change the switching pattern depending on the actual LED currents and required auxiliary current $I_{Aux}$ (which can be deduced by the control either by measuring $I_{Aux}$ or by calculating $I_{Aux}$. The calculation of $I_{Aux}$ is possible as the capacitance of capacitor 204, the capacitor voltage which is identical with the auxiliary voltage $V_{Aux}$, all the LED currents, and the switching states of the switches are known.).

In one example embodiment, every time the auxiliary voltage $V_{Aux}$ reaches the lower threshold level $V_{th1}$ (see FIG. 2d) the combination of those switches are turned off that make the sum of the currents through diodes D1-Dn become as close as possible to twice the auxiliary current $I_{Aux}$. In one such embodiment, it is only decided once every cycle which switches will be turned off (and those switches will remain off for the entire "half-cycle"). When the upper threshold level $V_{th2}$ is reached, all switches may be turned on. By trying to make the sum of the diode currents as close as possible to twice the auxiliary current the charging and discharging time of the capacitor will be about the same, and in addition, the frequency of the ripple on $V_{Aux}$ will be relatively constant irrespective of the actual dimming levels set for the different LED strings. A relatively constant frequency of the ripple translates to the fact that very high and very low switching speeds are avoided (Comment: One would end up with very low switching speeds if the sum of the diode currents would be chosen to be just slightly above the value of $I_{Aux}$. One might end up with very high switching speeds if the sum of the diode currents would be much larger than $I_{Aux}$, leading to a very quick charging of 204.). Very high switching speeds are less desirable as this may lead to reduced efficiency. Very low switching speeds are also less desirable as in such cases flicker might be visually perceptible in case of non-ideal dynamical behavior of the current sources.

In another example embodiment, the bidirectional communication between controller 205 and control stage 212 also allows 212 to adjust the set currents of the current sources dynamically in order to mitigate potential effects on the LED currents due to non-ideal dynamic response if the current sources IS1-ISn. In one such embodiment, in order to allow control stage 212 to achieve this dynamical improvement, controller 205 communicates anticipated switching events (i.e., what switch(es) will be opened or closed in Δt=30 microseconds) to control stage 212. Controller 205 determines the proper timing, meaning when to send such a message to 212, by assuming that the rate of voltage change on 204 will be constant. A fixed time span of 30 microseconds for all current sources regardless of whether the switch was turned on or off was used in one example embodiment. In another such embodiment, the time span Δt is selected based on the dynamic response of the current source and the communication speed and methods used in the particular embodiment, hence it will be different in other embodiments.

Figure 3:
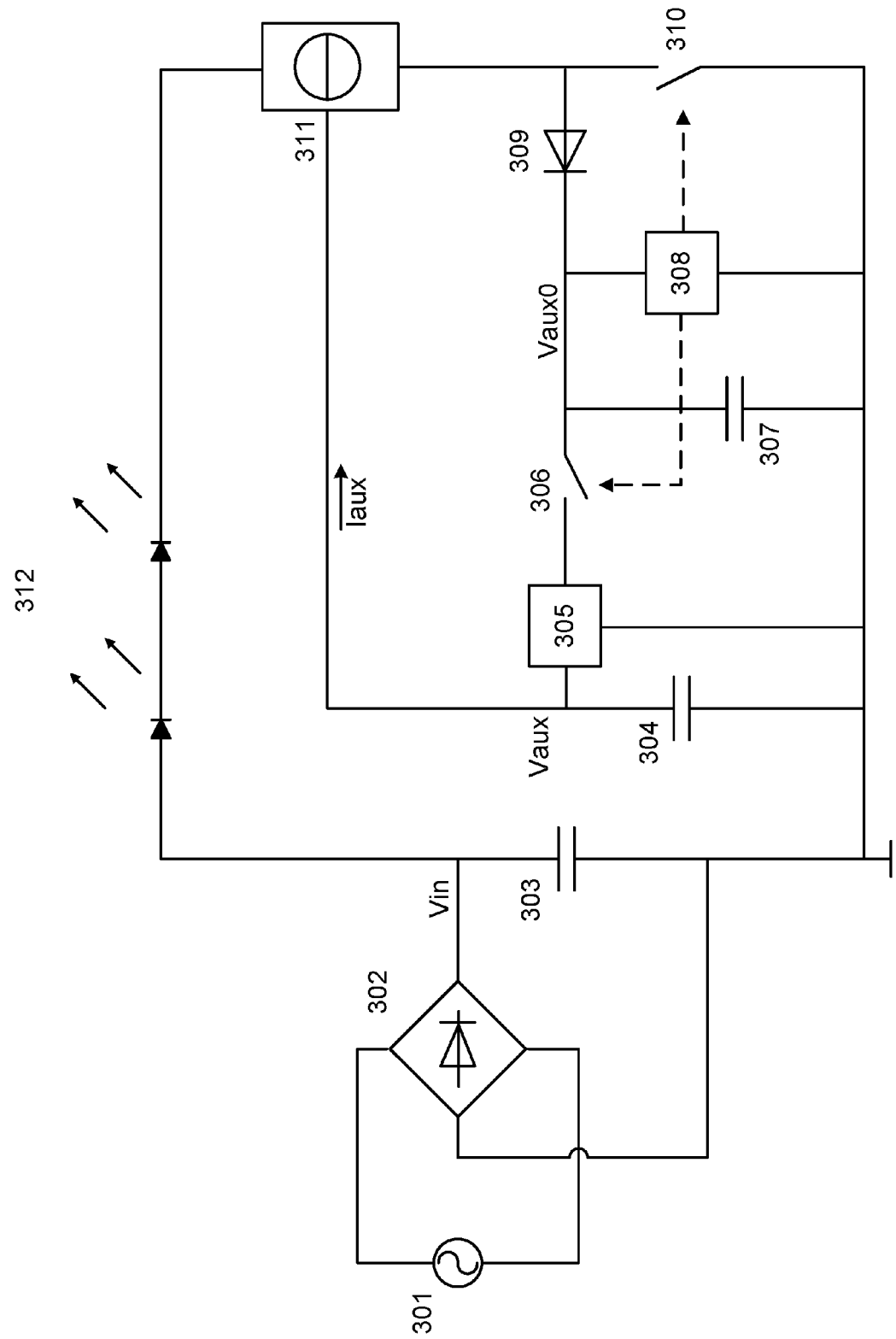
FIG. 3 shows an alternate circuit design of an LED driver utilizing the LED current in the auxiliary power supply, implemented according to one embodiment of the present invention.

FIG. 3 shows a circuit diagram of a constant current LED driver including a linear regulator that provides the final auxiliary voltage $V_{aux}$, according to one embodiment of the present invention. The circuit is powered by AC voltage source 301, which is connected to rectifier 302. In alternative embodiments, the power source could be a DC voltage source, a battery, or any other suitable power source. Rectifier 302 is connected to input capacitor 303 and LED string 312. The example circuit also includes constant current source 311 and an auxiliary power supply which includes capacitor 307, diode 309, controller 308, switches 306 and 310, linear regulator 305, and blocking capacitor 304 associated with the regulator 305. The blocking capacitor 304 has a significantly smaller capacity compared with capacitor 307 (in one embodiment 304 has one hundred times the capacity of 307). The regulator reduces the voltage ripple present in $V_{aux0}$ and produces an auxiliary voltage output $V_{aux}$. In this particular embodiment, switches 306 and 310 are controlled by controller 308. When the circuit initially starts, switches 306 and 310 are both open, so that the voltage at the output of diode 309 ($V_{aux0}$) begins approaching a second threshold voltage $V_{th2}$. When $V_{aux0}$ reaches $V_{th2}$, controller 308 turns on both switches, causing auxiliary current $I_{aux}$ to be provided to the current source 311 from the charged capacitor 307. After this point, switch 306 may be kept on until the system powers down. As capacitor 307 discharges, $V_{aux0}$ decreases. When voltage threshold $V_{th1}$ is reached, controller 308 opens switch 310, causing current to flow through diode 309, recharging capacitor 307 until threshold voltage $V_{th2}$ is reached again. Because switch 306 remains on, auxiliary current $I_{aux}$ continues to be provided to current source 311 while capacitor 307 is recharging.

The additional switch 306 prevents a discharging of capacitor 307 at startup and the potential issue that the circuit may never fully start up. By not providing any auxiliary power until the capacitor 307 sufficiently charged, successful startup may be achieved. This additional switch may be particularly beneficial for start-ups at low input voltages and in the case of very long LED strings with associated switches. Switch 306 delays providing an auxiliary current to the current source 311 until capacitor 307 is sufficiently charged in order to guarantee the voltage on capacitor 307 will reach threshold value $V_{th2}$ more rapidly upon startup.

In the case of very long LED strings, normally-off switches may be used. This implementation allows for the maximum number of LEDs being present at startup. To achieve good efficiencies, the overall number of LEDs may be chosen in such a way that even at high line voltage and at the crest of the line voltage, the voltage drop across the current source is low. At nominal or even low input voltages, only a very small LED string current will flow at startup to initially charge capacitor 307. In the case where the auxiliary current is higher than the initial LED current, the circuit may not start up properly if $I_{aux}$ is initially applied to current source 311. In such cases, having the additional switch 306 may therefore be advantageous.

Figure 4:
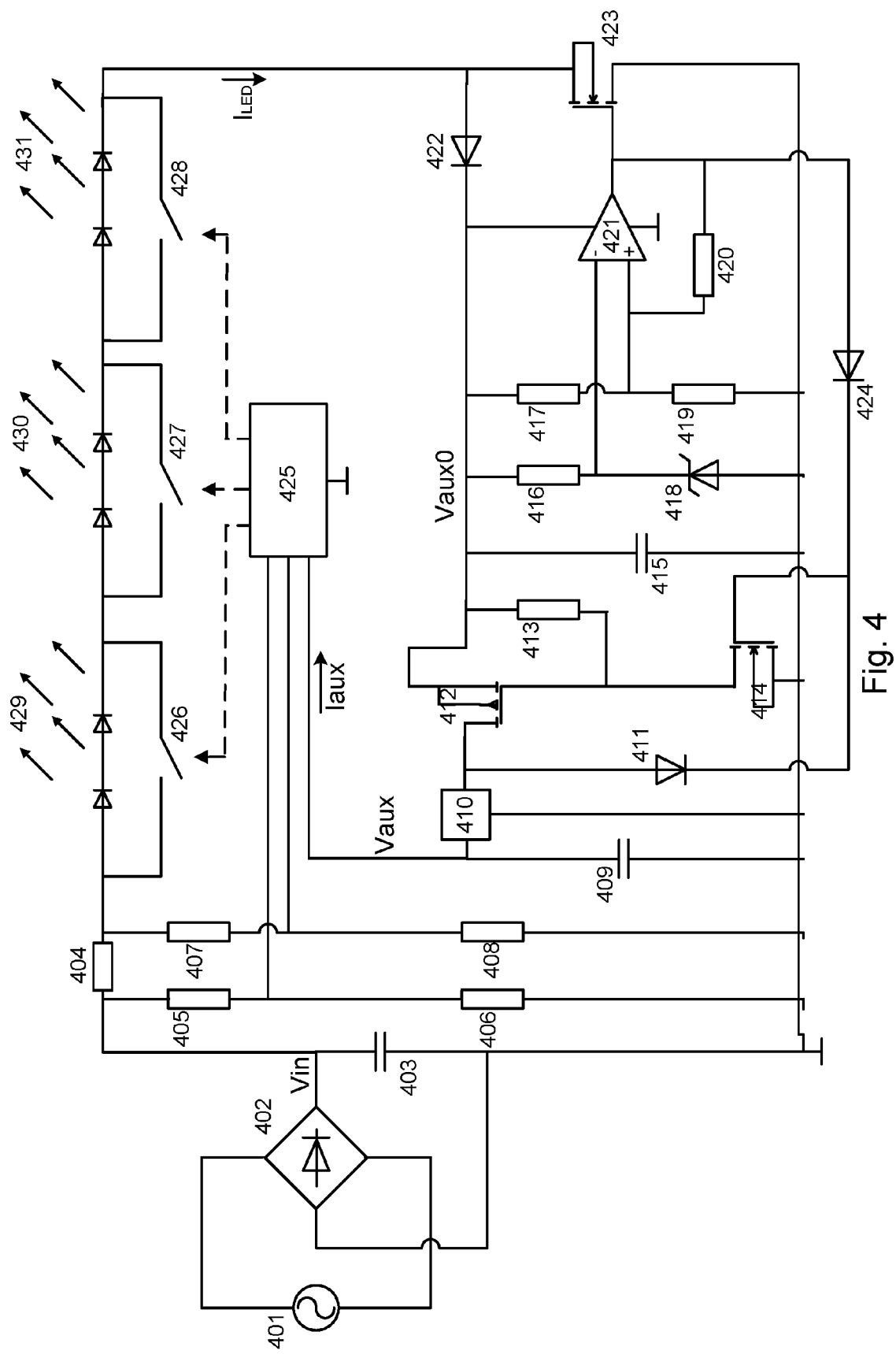
FIG. 4 shows an alternate circuit design of an LED driver including multiple serial sub-groups of LEDs, implemented according to one embodiment of the present invention.

FIG. 4 shows a particular embodiment of a LED driver circuit with a string of LEDs driven by a "zero-energy-storage driver", according to one embodiment of the present invention. Herein a "zero-energy-storage driver" is understood as an LED driver which has no significant energy storage in the main power path, however capacitive and/or inductive energy storage within the control part of the LED driver may still be present. For certain applications "zero-energy-storage drivers" may be very suited as such drivers can be made small and at low cost. This particular embodiment is powered by AC voltage source 401, connected to voltage rectifier 402. In alternative embodiments, the power source could be a DC voltage source, a battery, or any other suitable power source. The output of voltage rectifier 402 (with voltage $V_{in}$) is connected to input capacitor 403. The circuit also includes LED strings 429, 430, and 431, each connected in parallel with switches 426, 427, and 428 respectively. Each of switches 426-428 are controlled by control circuitry 425. In one example embodiment, the control circuitry 425 comprises a microcontroller. Control circuitry 425 is also connected to two parallel voltage dividers and the auxiliary power supply. The first voltage divider includes resistors 405-406 and the second voltage divider includes resistors 407-408. In this particular embodiment, the function of current source is realized by resistor 404 and control circuitry 425 turning on and off the switches 426-428. In one specific example embodiment, the switches 426-428 may be made of enhancement-mode N-channel MOSFETs (normally-off devices) and suitable gate drive circuitry, although any number of suitable switching devices can be used. In one example embodiment, control circuitry 425 determines how many switches need to be in the "on" state based on the current through resistor 404. This current is sensed by differential measurement of the voltage drop across resistor 404 utilizing the two voltage dividers 405-406, and 407-408. The set value of the current through the LEDs ($L_{LED}$) may be varied by the microcontroller based on the input voltage in order to achieve a desired power factor. The input voltage is already known to the microcontroller as the voltage of the resistor divider 405-406 is already measured. This particular embodiment illustrates three serial LED strings with three switches controlled by the microcontroller, however, the present invention is not limited to any particular number of LED sub-groups or switches and many different implementations will be apparent in light of this disclosure.

The control circuitry 425 is also connected to the auxiliary power supply, which in this particular embodiment includes, linear regulator 410, blocking capacitor 409 associated with the regulator 410, diode 411, transistors 412 and 414, resistor 413, capacitor 415, Zener diode 418, resistors 416-417 and 419-420, comparator 421, diode 422, transistor 423, and diode 424. Transistors 412 and 414 may be normally-off devices designed so that the voltage on capacitor 415 will increase rapidly upon startup and there will be no provided to control circuitry 425 until transistor 412 switches on. The output of diode 422 provides an initial auxiliary voltage $V_{aux0}$. Comparator 421 is hysteric, and the amount of hysteresis $V_{th2}-V_{th1}$ is set by resistor 420. Besides resistor 420 the threshold voltages $V_{th2}$ and $V_{th1}$ are set by Zener diode 418 and the resistors of the voltage divider 417 and 419. $V_{th2}$ and $V_{th1}$ are the threshold voltages between which $V_{aux0}$ is maintained by transistor 423. When transistor 423 is in the off state, the LED current can pass through diode 422 and charge capacitor 415 until $V_{aux0}$ reaches threshold voltage $V_{th2}$. When $V_{th2}$ is reached, transistor 423 is turned on, bypassing diode 422 and capacitor 415. The regulator 410 may reduce voltage ripple and provide auxiliary current $I_{aux}$ and auxiliary voltage $V_{aux}$ to the control circuitry 425. The steady state average of $V_{aux0}$ can be calculated as $V_{aux0}=(V_{th2}-V_{th1})/2$ and is defined by Zener diode 418 which serves as a reference voltage source. The first time comparator 421 switches from low to high output, the gate of transistor 414 is pulled high through diode 424. This turns on transistor 414 and immediately thereafter turns on transistor 412. The state of transistor 412 may then be locked in the on state until power is taken off the circuit by diode 411.

Figure 5A:
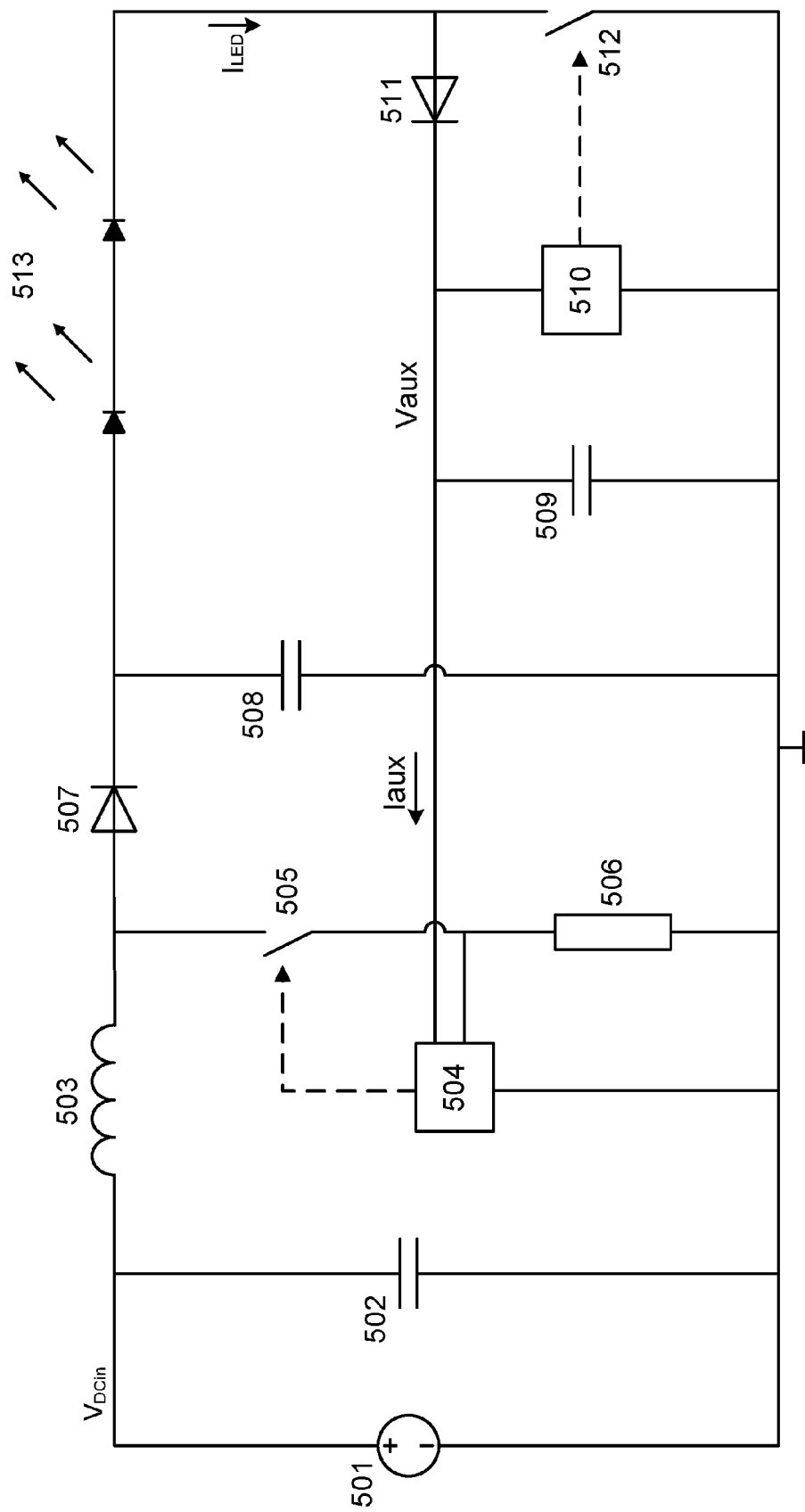
FIG. 5a shows a circuit design of a LED driver utilizing a boost converter as a current source, implemented according to one embodiment of the present invention.

FIG. 5a shows a LED driver circuit design utilizing a boost converter as current source, according to one embodiment of the present invention. In this particular embodiment, a DC voltage source 501 provides voltage $V_{DCin}$ to the circuit. In alternative embodiments, the power source could be an AC voltage source, a battery, or any other suitable power source. The voltage source is connected parallel to input capacitor 502. The LED driver circuit also includes inductor 503, diode 507, output capacitor 508, current sense resistor 506, control circuitry 504, switch 505 which is controlled by control circuitry 504, an LED string 513, and an auxiliary power supply. The auxiliary power supply in this embodiment includes capacitor 509, controller 510, diode 511, and switch 512. Any ripple present through the LED string 513 may significantly reduce efficiency; thus capacitor 508 acts to reduce ripple through the LED string. The controller 510 is connected to the output of diode 511, where it can monitor the auxiliary voltage $V_{aux}$, located at the node of capacitor 509, controller 510, and diode 511. If $V_{aux}$ falls below a determined threshold voltage $V_{th1}$, then controller 510 turns switch 512 off and the capacitor 509 may be charged by the LED current $I_{LED}$ flowing through LED string 513 and diode 511. As long as switch 512 is open, $V_{aux}$ rises. As $V_{aux}$ reaches a second threshold voltage $V_{th2}$, controller 510 closes switch 512 causing the LED current to bypass diode 511 and capacitor 509, disconnecting the auxiliary supply from the main power path. Auxiliary current $I_{aux}$ is the current provided to control circuitry 504 from the auxiliary power supply circuitry.

This particular example embodiment utilizes a boost converter as current source to drive the LED string 513. The boost converter is controlled by control circuitry 504 which drives switch 505, and the switch current may be sensed by resistor 506. Voltage $V_{aux}$ that is provided to control circuitry 504 from the auxiliary power supply circuit serves a dual purpose: it is used to power the controller, and also to measure the current $L_{LED}$ by analyzing the voltage ripple. Control circuitry 504 measures $T_{on}$, $T_{off}$. The threshold levels $V_{th1}$, and $V_{th2}$ are fixed by design but may also be measured by the control circuitry 504 (e.g. for improved accuracy). As the capacity $C_{509}$ of the capacitor 509 is known, the charge transferred to and from capacitor 509 is known, control circuitry 504 is able to determine $I_{aux}$ and $I_{LED}$ by the following formulas:

$$I_{aux}=C_{509}*(V_{th2}-V_{th1})/T_{on}, \text{ and}$$

$$I_{LED}=C_{509}*(V_{th2}-V_{th1})/T_{off}+I_{aux},$$

which were derived from Equations 1 through 3 above. The indirectly measured current $I_{LED}$ may now be used by control circuitry 504 as an input signal for the closed-loop regulation of $I_{LED}$ by varying the duty cycle of switch 505.

Figure 5B:
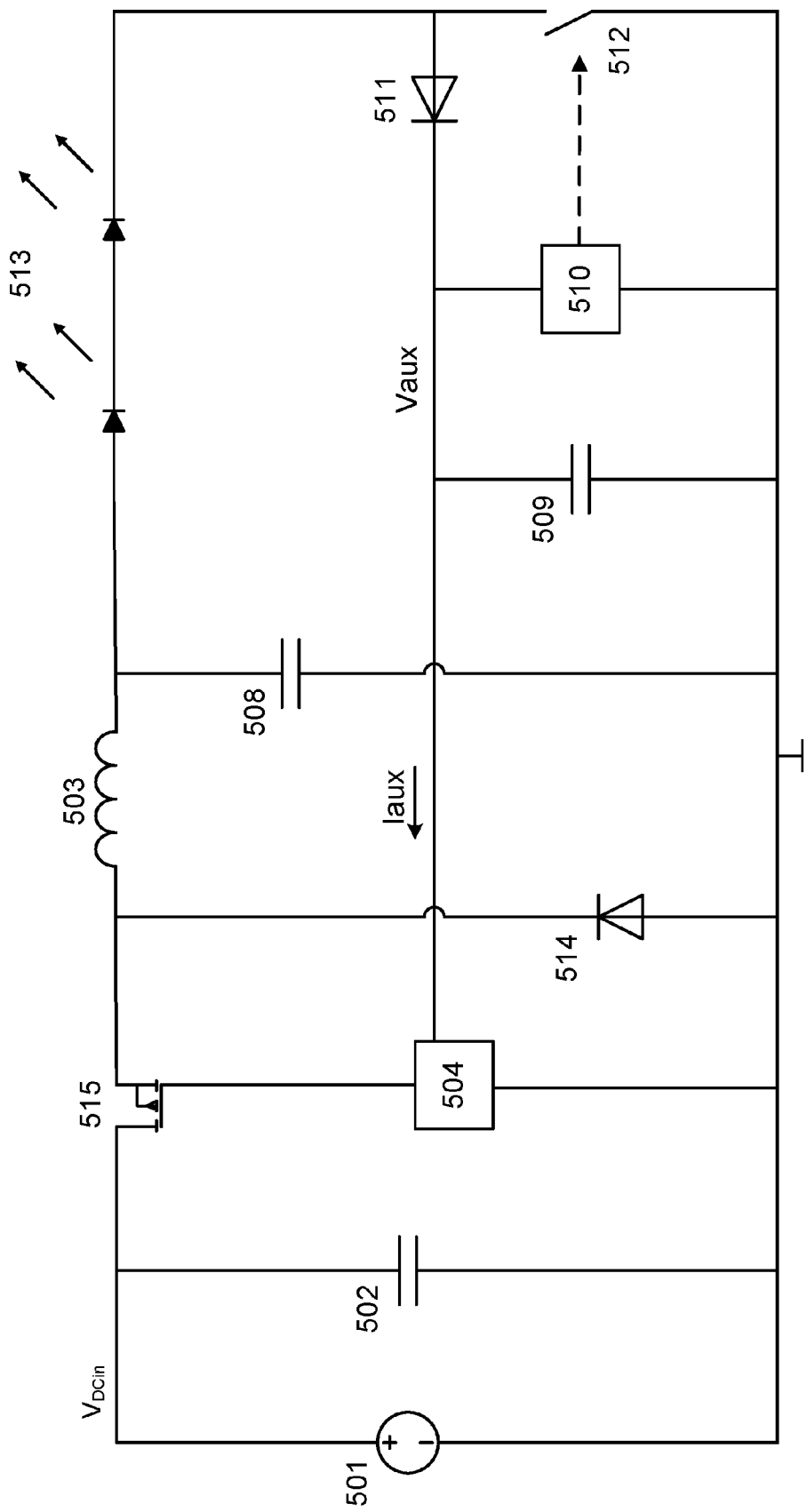
FIG. 5b shows a circuit design of a LED driver utilizing a buck converter as a current source, implemented according to one embodiment of the present invention.

FIG. 5b shows another embodiment of the LED driver circuit according to one embodiment of the present invention. In this particular example embodiment, the voltage source 501, input capacitor 502, output capacitor 508, LED string 513, and auxiliary power supply operate as described in reference to FIG. 5a. However, in this example case, a buck converter is utilized as the current source for the LED string 513. In the case of a buck converter (and derived topologies) a normally-on switch may be used to allow for some initial current charging the capacitor 509 at the startup. The claimed invention is not intended to be limited to any particular converter or current source, and other embodiments using switch-mode converters may be built in a similar fashion.

Figure 6A:
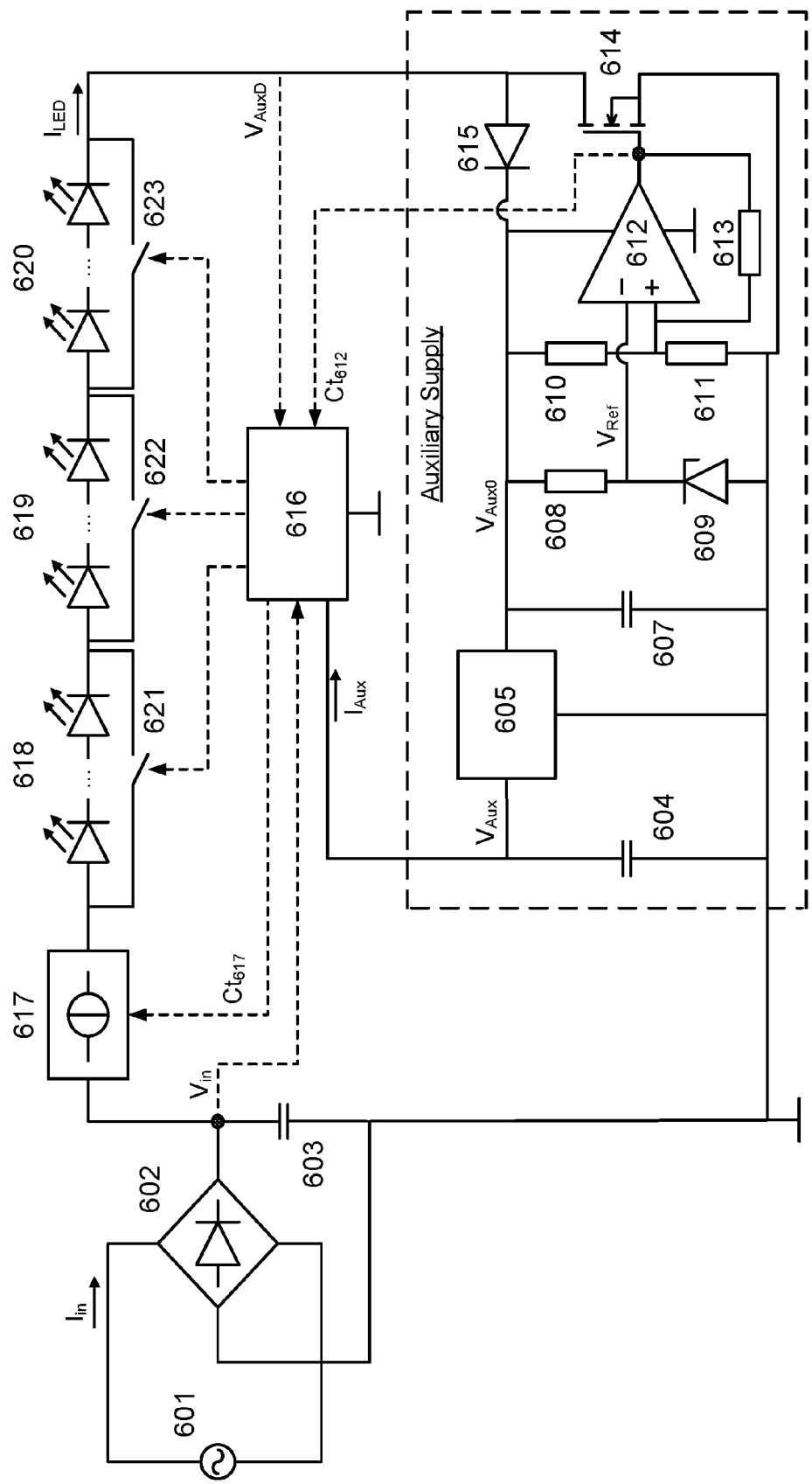
FIG. 6a shows a particular LED driver circuit with multiple LED strings and an auxiliary power supply without line synchronization, according to one embodiment of the present invention.

FIG. 6a shows a particular LED driver circuit with multiple LED strings and an auxiliary power supply without line synchronization, according to one embodiment of the present invention. This particular embodiment is powered by AC voltage source 601, connected to voltage rectifier 602. In alternative embodiments, the power source could be a DC voltage source, a battery, or any other suitable power source. The output of voltage rectifier 602 (with voltage $V_{in}$) is connected to input capacitor 603. The circuit also includes a current source 617 and LED strings 618, 619, and 620 each connected in parallel with switches 621, 622, and 623 respectively. The shorting of LED strings by closing the switches 621, 622 and 623 allows varying the "effective overall LED string" length. Each of the LED strings 618, 619, and 620 may be comprised of a different number of LEDs, hence each LED string may have a different length. Each of switches 621-623 are controlled by control circuitry 616. The control circuitry 616 is comprises a microcontroller. Control circuitry 616 is also connected to an auxiliary power supply. In one specific example embodiment, the switches 621-623 may be made of enhancement-mode N-channel MOSFETs (normally-off devices) and suitable gate drive circuitry, although any number of suitable switching devices can be used. This particular embodiment illustrates three serial LED strings with three switches controlled by the microcontroller, however, the present invention is not limited to any particular number of LED sub-groups or switches and many different implementations will be apparent in light of this disclosure.

In this example embodiment, the control circuitry 616 is also connected to the auxiliary power supply, which in this particular embodiment includes, linear regulator 605, blocking capacitor 604 associated with the regulator 605, capacitor 607, Zener diode 609, resistors 608, 610-611, and 613, transistor 614, comparator 612, and diode 615. The output of diode 615 provides an initial auxiliary voltage $V_{aux0}$. Comparator 612 may be hysteretic, and the amount of hysteresis $V_{th2}-V_{th1}$ is set by resistor 613. Besides resistor 613, the threshold voltages $V_{th2}$ and $V_{th1}$ are set by Zener diode 609 and the resistors of the voltage divider 610 and 611. $V_{th2}$ and $V_{th1}$ are the threshold voltages between which $V_{aux0}$ is maintained by transistor 614. When transistor 614 is in the off state, the LED current can pass through diode 615 and charge capacitor 607 until $V_{aux0}$ reaches threshold voltage $V_{th2}$. When $V_{th2}$ is reached, transistor 614 is turned on, bypassing diode 615 and capacitor 607. The regulator 605 may reduce voltage ripple and provide auxiliary current $I_{aux}$ and auxiliary voltage $V_{aux}$ to the control circuitry 616. The steady state average of $V_{aux0}$ can be calculated as $V_{aux0}=(V_{th2}-V_{th1})/2$ and is defined by diode Zener 609 which serves as a reference voltage source.

One of the tasks of the control circuitry 616 in this particular example is to ensure that the LED strings generate the desired amount of light, e.g. over one full line-cycle. This means that the current flowing through the LED strings 618-620 is controlled. Controlling the currents through the LED strings is accomplished by commanding a set-current for the current source 617 (through control line $Ct_{617}$) and—as mentioned above—by controlling the switches 621-623. The control circuitry 616 may take the instantaneous input voltage Vin into account, e.g. in order to achieve high efficiency, and/or in order to draw a line current $I_{in}$ that closely follows the shape of the input voltage over time for achieving a high power factor. Defining the shape of the desired input current (which is the set-current for the close-loop control implemented by control circuitry 616) defines the shape of the LED current $I_{LED}$ as a function of time. In one example embodiment, the input capacitor 603 is small (such as in the case of an AC LED driver with zero or low-energy storage) and hence the set-current for the LED current $I_{LED}$ can easily derived by the control circuitry by taking the absolute value of the desired line current $I_{in}$ (due to the low capacitance of the input capacitor 603 it is a very good assumption to state that the LED current $I_{LED}$ is the rectified line current $I_{in}$).

The control circuitry 616 is provided by the input voltage $V_{in}$ as well as the voltage drop across the auxiliary power supply $V_{AuxD}$. From these voltages 616 can deduce the voltage $V_{ava}=V_{in}-V_{AuxD}$. $V_{ava}$ is the (available) voltage across the "effective overall LED string" and the current source. $V_{ava}$ may be used by the control strategy implemented in the control circuitry 616 as described later. In this example embodiment, instead of using $V_{ava}$, the signal $Ct_{612}$ from the comparator of the auxiliary circuit may be supplied to the control circuitry 616 (both options—supplying 616 with $V_{AuxD}$ and $Ct_{612}$—are shown in FIG. 6a). The signal $Ct_{612}$ provides 616 with the information whether the switch 614 is on or off. As the auxiliary voltage $V_{aux}$ is fixed (616 gets supplied by the auxiliary voltage $V_{aux}$, hence it can be measured or used in 616), the control circuitry 616 can deduce the voltage $V_{avaA}$:

$V_{avaA} = V_{in} - \text{alpha} * V_{aux}$ if $Ct_{612}$ is low, $V_{avaA} = V_{in}$ if $Ct_{612}$ is high.

The factor alpha (chosen to be above one, e.g. 1.35) accounts for the voltage drop across the diode 615 and the linear regulator 605. In cases relevant to practical application $V_{avaA}$ is a good approximation of $V_{ava}$ and may be used instead of $V_{avaA}$ (for sake of a simpler implementation).

One example control strategy to determine the "effective overall LED string" length, meaning a control strategy implemented in 616 controlling switches 621-623 over time is based on $V_{ava}$ (or $V_{avaA}$ instead). The control circuitry 616 can maximize the "effective overall LED string" length under the constraint that there has to be some (potentially very small) voltage left for the current regulator 617 to perform its operation. The control circuitry 616 will turn on as many LEDs (their voltage-current-characteristic is known) as possible but still keep the "effective overall LED string" voltage below $V_{ava}$ (or $V_{avaA}$ instead). This optimization/maximization may be carried out at any moment in time. One preferred embodiment however uses a digital implementation with a microcontroller and performs this optimization only at predetermined points in time, e.g. periodically 26 times every line-cycle.

The voltage difference between $V_{ava}$ and the "effective overall LED string" voltage appears across the current source 617, which gets minimized by the above mentioned optimization. Hence this control strategy maximizes the efficiency of the driver (in particular if the current source is based on a linear regulator). The described control strategy and circuitry allows 616 to perform its task without actually measuring or even knowing the actual LED currents.

Figure 6B:
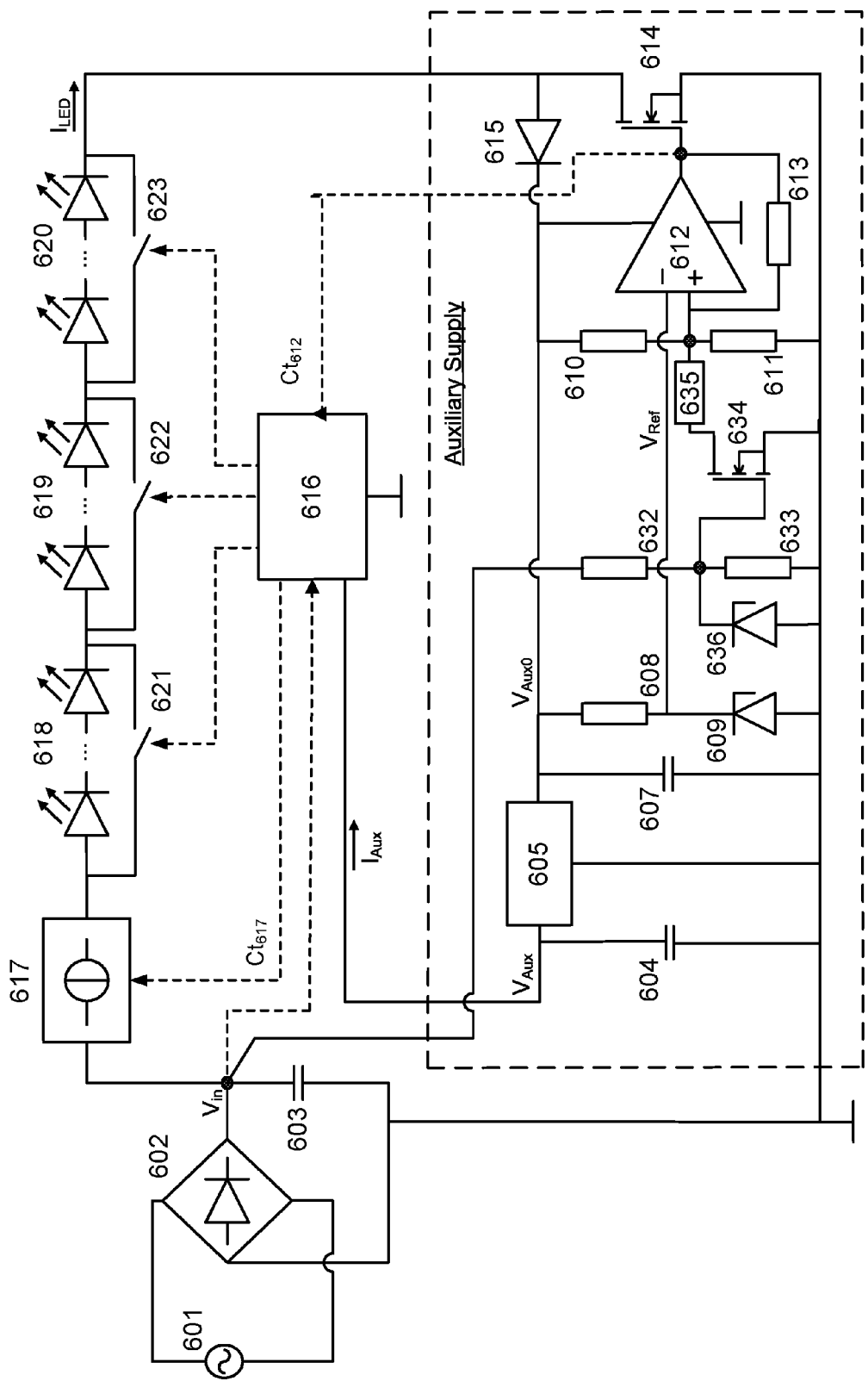
FIG. 6b shows a particular LED driver circuit with multiple LED strings and an auxiliary power supply with line synchronization, according to one embodiment of the present invention.

FIG. 6b shows a particular LED driver circuit with multiple LED strings and an auxiliary power supply with line synchronization, according to one embodiment of the present invention. The structure of the example circuit in FIG. 6b is similar to that of FIG. 6a, except for the auxiliary supply includes transistor 634, resistor 635, resistors 632-633, and optional Zener diode 636. In one example embodiment, the input capacitor 603 is small (such as in the case of an AC LED with zero or low-energy storage) and the LED string voltage will vary depending on the line voltage and should achieve a good power factor. Hence, at low instantaneous line voltages (away from the crest of the line) the current through the LED string might be of the order of Iaux or even below Iaux. In such an example, capacitor 607 must be sized sufficiently large to be able to supply energy in those time periods. There is the potential for low frequency flicker, if e.g. capacitor 607 is recharged only every fifth line half-cycle. This has the potential to create a light modulation with f=1/(5*(1/240 Hz))=240 Hz/5=48 Hz because in the line cycles where there is the charging of capacitor 607, the LEDs might create less light. In order to avoid this issue, in one embodiment the charging of capacitor 607 and the switching of transistor 614 are synchronized with the line voltage. In one embodiment, this is achieved by adjusting the voltage divider 610 and 611, as shown in FIG. 6b (either in a more analog fashion, or with the optional Zener diode 636 in a more switching fashion): At increasing line voltages, coinciding with an increase of $V_{in}$, the transistor 634 turns on (or gets more into conduction) as its gate voltage rises which is supplied by the voltage divider 632 and 633. The resistor 635 and the transistor 634 create a parallel path to resistor 611 which overall alters the voltage divider 610 and 611 based on the line voltage. In such an example embodiment, as the line voltage increases, the voltage potential on the non-inverting input of comparator 612 falls, and hence the comparator is more likely to turn transistor 614 off. This ensures that every line half-cycle the capacitor 607 gets recharged and an oscillation at low frequency is avoided.

Numerous embodiments will be apparent, and features described herein can be combined in any number of configurations. One example embodiment of the present invention provides a lighting driver circuit. The lighting driver circuit includes a current source for controlling a current through at least one lighting element, and an auxiliary power supply for selectively receiving the current so as to charge the auxiliary power supply with the current and to supply auxiliary power to a secondary circuit. In some cases, the secondary circuit is the current source, driver control circuitry, and/or a motor that may or may not be included within the LED driver circuitry. In some cases, the auxiliary power supply includes a capacitor, at least one diode whose anode is connected to receive the current and whose cathode is connected to the capacitor, and a first switch connected to the anode of the diode, and when the first switch is closed it prevents the auxiliary power supply from receiving the current. In one such case, the lighting driver circuit further includes a linear voltage regulator connected between the cathode of the diode and the secondary circuit. In one such case, the lighting driver circuit further includes a controller for controlling the first switch based on the voltage at the cathode of the diode. In one such case, the first switch is a normally-off switch, and the controller is configured to close the first switch when the voltage on the cathode of the diode reaches an upper threshold voltage value after startup, and to open the first switch when the voltage on the cathode of the diode falls below a lower threshold voltage value. In one such case, the lighting driver circuit further includes a second switch located between the capacitor and the secondary circuit. There might be a linear regulator in-between the second switch and the secondary circuit. In one such case, the second switch is a normally-off switch, and the controller is configured to close the second switch when the voltage on the cathode of the diode reaches an upper threshold voltage value. In one such case, the second switch is configured to remain closed throughout remaining circuit operation time after the upper threshold voltage value is reached. In some cases, the current source includes a boost converter. In some cases, the current source includes a buck converter. In some cases, the lighting driver circuit further includes an LED string. In some cases, the lighting driver circuit further includes a plurality of LEDs, and further includes at least one normally-off switch connected in parallel to sub-groups of the LEDs.

Another embodiment of the present invention provides a method of supplying auxiliary power to a lighting circuit. The method includes controlling a current through at least one lighting element with a current source. The method further includes selectively directing the current through the at least one lighting element to an auxiliary power supply so as to charge the auxiliary power supply with the current. The method further includes providing auxiliary power to a secondary circuit from the auxiliary power supply. In some cases, selectively directing the current includes directing the current through a diode to a node connecting the cathode of the diode with a capacitor and an auxiliary power input of the secondary circuit. In one such case, the method further includes reducing voltage ripple between the cathode of the diode and the current source using at least one linear voltage regulator. In one such case, selectively directing the current includes controlling a first switch to prevent the auxiliary power supply from receiving the current when the voltage on the capacitor reaches an upper threshold voltage, and allowing the auxiliary power supply to receive the current when the voltage on the capacitor falls below a lower threshold voltage. In one such case, selectively directing the current further includes charging the capacitor upon startup by maintaining open a second switch, located between the capacitor and the current source, until the voltage on the capacitor reaches the upper threshold voltage, and closing the second switch when the upper threshold voltage is reached. In another such case, the first switch is synchronized with the voltage at the input of the current source. In another such case, the condition of the first switch is communicated to control circuitry of the lighting driver circuit. In one such case, the control circuitry of the lighting driver circuit takes the voltage drop across the auxiliary power supply into consideration when controlling the lighting driver. In some cases, the secondary circuit includes a current source, a driver control circuit, and/or a motor.

Another embodiment of the present invention provides an LED driver system. The system includes a number of LED strings. The system further includes a number of current sources for supplying a current to each of the LED strings. The system further includes at least one auxiliary power supply for selectively receiving the current from at least one of the LED strings and supplying auxiliary power to at least one secondary circuit after startup of the LED driver circuit. In some cases, the auxiliary power supply supplies auxiliary power to the at least one secondary circuit by measuring the voltage level of a capacitor located within the auxiliary power supply and controlling at least one switch located within the auxiliary power supply based on the voltage level of the capacitor. In one such case, the at least one auxiliary power supply is configured to selectively receive current from all of the LED strings. In another such case, the secondary circuit is a driver control circuit that is in communication with the current sources, and the system further includes an auxiliary controller within the auxiliary power supply that is in communication with the driver control circuit and is configured to operate the at least one switch.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A lighting driver circuit, comprising:
a current source configured to control a current through at least one lighting element; and
an auxiliary power supply configured to selectively receive the current so as to charge the auxiliary power supply with the current and provide auxiliary power to a secondary circuit, wherein the auxiliary power supply comprises:
a capacitor;
at least one diode whose anode is connected to receive the current and whose cathode is connected to the capacitor; and
a first switch connected to the anode of the diode, and when the first switch is closed it prevents the auxiliary power supply from receiving the current.

2. The lighting driver circuit of claim 1, wherein the secondary circuit comprises at least one of the current source, driver control circuitry, and/or a motor.

3. The lighting driver circuit of claim 1, further comprising a linear voltage regulator connected between the cathode of the diode and the secondary circuit.

4. The lighting driver circuit of claim 1, further comprising a controller configured to control the first switch based on the voltage at the cathode of the diode.

5. The lighting driver circuit of claim 4, wherein the first switch is a normally-off switch, and the controller is configured to close the first switch when the voltage on the cathode of the diode reaches an upper threshold voltage value, and to open the first switch when the voltage on the cathode of the diode falls below a lower threshold voltage value.

6. The lighting driver circuit of claim 4, further comprising a second switch located between the capacitor and the secondary circuit.

7. The lighting driver circuit of claim 6, wherein the second switch is a normally-off switch, and the controller is configured to close the second switch when the voltage on the cathode of the diode reaches an upper threshold voltage value.

8. The lighting driver circuit of claim 7, wherein the second switch is configured to remain closed throughout remaining circuit operation time after the upper threshold voltage value is reached.

9. The lighting driver circuit of claim 1, wherein the current source comprises at least one of a boost converter and/or a buck converter.

10. The lighting driver circuit of claim 1, further comprising at least one lighting element, wherein the at least one lighting element comprises an LED string.

11. The lighting driver circuit of claim 1, further comprising at least one lighting element, wherein the at least one lighting element comprises a plurality of LEDs, and further comprising at least one normally-off switch connected in parallel to sub-groups of the LEDs.

12. A method of creating auxiliary power in a lighting circuit, comprising:
controlling a current through at least one lighting element with a current source;
selectively directing the current through the at least one lighting element to an auxiliary power supply so as to charge the auxiliary power supply with the current, wherein selectively directing the current comprises directing the current through a diode to a node connecting the cathode of the diode with a capacitor and an auxiliary power input of the secondary circuit; and
providing auxiliary power to a secondary circuit from the auxiliary power supply.

13. The method of claim 12, further comprising reducing voltage ripple between the cathode of the diode and the secondary circuit using at least one linear voltage regulator.

14. The method of claim 12, wherein selectively directing the current comprises controlling a first switch to prevent the auxiliary power supply from receiving the current when the voltage on the capacitor reaches an upper threshold voltage, and allowing the auxiliary power supply to receive the current when the voltage on the capacitor falls below a lower threshold voltage.

15. The method of claim 14, wherein selectively directing the current further comprises charging the capacitor upon startup by maintaining open a second switch, located between the capacitor and the secondary circuit, until the voltage on the capacitor reaches the upper threshold voltage, and closing the second switch when the upper threshold voltage is reached.

16. The method of claim 14, wherein the first switch is synchronized with the voltage at the input of the current source.

17. The method of claim 14, wherein the condition of the first switch is communicated to control circuitry of the lighting driver circuit.

18. The method of claim 17, wherein the control circuitry of the lighting driver circuit takes the voltage drop across the auxiliary power supply into consideration when controlling the lighting driver.

* * * * *